United States Patent
Shinjo et al.

(10) Patent No.: US 6,528,992 B2
(45) Date of Patent: *Mar. 4, 2003

(54) MAGNETIC DETECTOR HAVING MAGNETIC FIELD SENSING DEVICE CENTRALLY ALIGNED WITH MAGNETIC FIELD GENERATOR

(75) Inventors: Izuru Shinjo, Tokyo (JP); Yasuyoshi Hatazawa, Tokyo (JP); Takuji Nada, Tokyo (JP); Masahiro Yokotani, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/168,669

(22) Filed: Oct. 9, 1998

(65) Prior Publication Data

US 2001/0045827 A1 Nov. 29, 2001

(30) Foreign Application Priority Data

Apr. 23, 1998 (JP) .......................................... 10-113521

(51) Int. Cl.[7] ................................................. G01B 7/30
(52) U.S. Cl. .............................. 324/207.21; 324/207.25
(58) Field of Search ........................ 324/207.2, 207.21, 324/207.22–207.25, 252; 338/32 H, 32 R

(56) References Cited

U.S. PATENT DOCUMENTS 5,367,257 A * 11/1994 Garsehlis .................... 324/165
5,402,064 A * 3/1995 Eck et al. .............. 324/207.12

FOREIGN PATENT DOCUMENTS

| DE | 34 26 784 | 1/1986 |
| DE | 195 07 304 | 9/1995 |
| DE | 196 80 089 | 4/1997 |
| DE | 196 49 400 | 12/1997 |
| JP | 7-260813 | 10/1995 |
| JP | 8-193839 | 7/1996 |

* cited by examiner

Primary Examiner—Jay Patidar
(74) Attorney, Agent, or Firm—Sughrue Mion, PLLC

(57) ABSTRACT

A magnetic detector for detecting a rotational angle of a gear-like rotary member of magnet material generates twice as many pulses as the number of projected or recessed portions of the rotary member of magnetic material. The magnetic detector comprises a magnet for generating a magnetic field, a rotary member of magnetic material disposed with a predetermined gap retaining relative to the magnet, and an magnetic field sensing device for detecting changes in the magnetic field by movement of the moving member of magnetic material. The magnetic field sensing device is disposed relative to the magnet so that a center axis of the magnetic field sensing device is aligned with a center axis of the magnet wherein a magnetic field acting on the magnetic field sensing device changes from positive to negative and from negative to positive with the movement of the moving member of magnetic material.

8 Claims, 18 Drawing Sheets

ROTARY SHAFT

MAGNETIZED DIRECTION
(OPPOSING DIRECTION TO
ROTARY MEMBER 21 OF
MAGNETIC MATERIAL)

MR DEVICE

FIRST CENTER AXIS

FIG. 3A
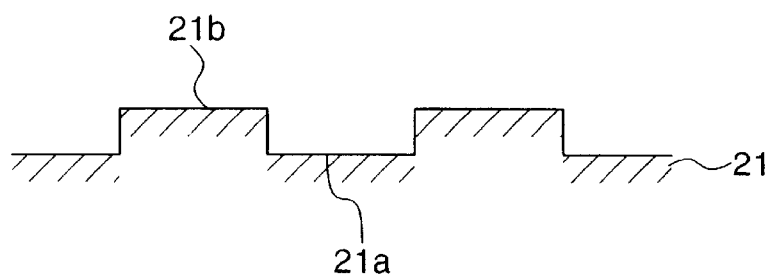
FIG. 3B
FIG. 3C
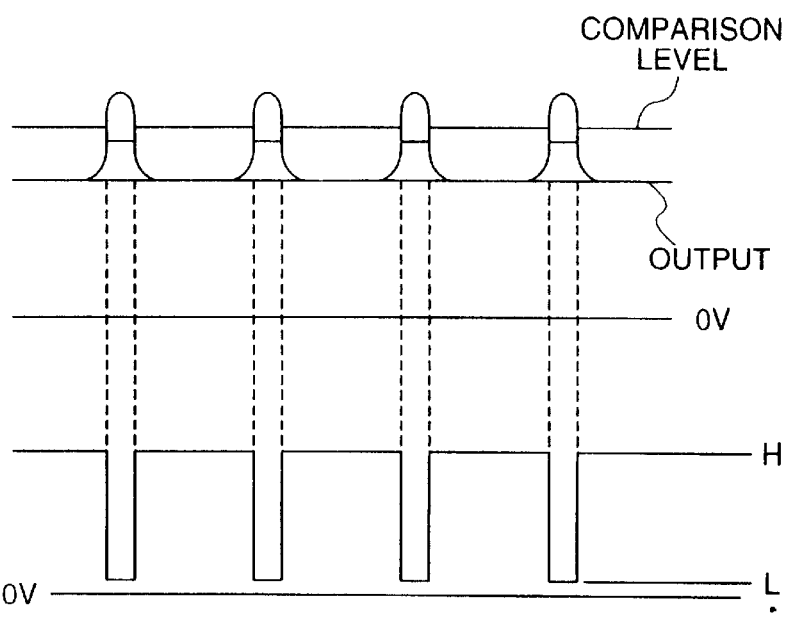

NEGATIVE | POSTIVE

ROTARY SHAFT

MAGNETIZED DIRECTION
(OPPOSING DIRECTION TO
ROTARY MEMBER 21 OF
MAGNETIC MATERIAL)

MR DEVICE

FIRST CENTER AXIS

FIG. 19A
PRIOR ART
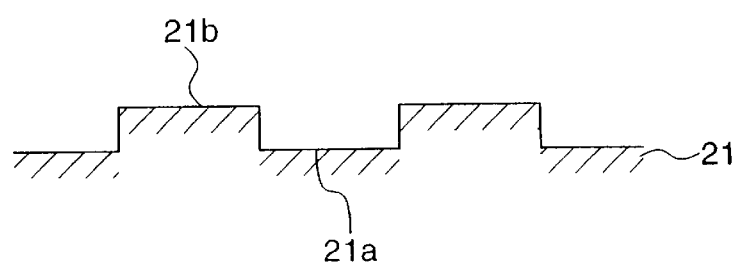
FIG. 19B
PRIOR ART
FIG. 19C
PRIOR ART
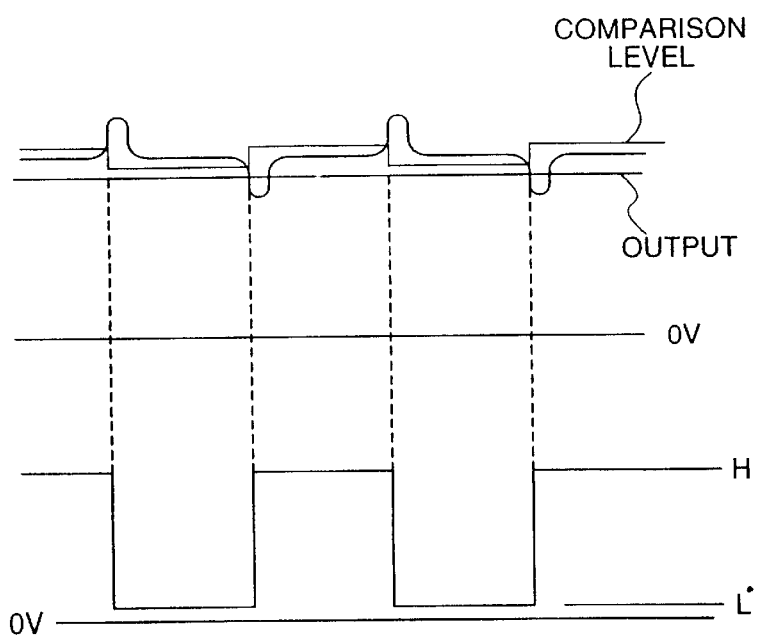

MAGNETIC DETECTOR HAVING MAGNETIC FIELD SENSING DEVICE CENTRALLY ALIGNED WITH MAGNETIC FIELD GENERATOR

BACKGROUND OF THE INVENTION

1. Field of the Invention

The present invention relates to a magnetic detector for detecting, e.g., a rotational angle of a gear-like rotary member of magnetic material, and more particularly to a magnetic detector for detecting, e.g., rotation information of an internal combustion engine.

2. Description of the Related Art

FIG. 15 is a side view of a conventional magnetic detector, FIG. 16 is a side sectional view thereof, and FIG. 17 is a schematic view of a magnetic circuit incorporated in the magnetic detector.

A detector body 1 comprises a cylindrical case 3 made of a synthetic resin, an electric circuit unit 4 housed in the case 3, a parallelepiped magnet 5 provided at a fore end of the electric circuit unit 4, and a detecting unit 6 provided in a front surface of the magnet 5 and including a magnetic field sensing device built therein.

In such a magnetic detector, when a gear-like rotary member of magnetic material 21 provided close to the magnetic detector is rotated, a recessed portion 21a and a projected portion 21b of the rotary member of magnetic material 21 alternately approaches the detecting unit 6, whereupon a magnetic field applied from the magnet 5 to the detecting unit 6 is changed. Changes in the applied magnetic field are detected as voltage changes by the detecting unit 6. The voltage changes are output to the external in the form of a pulse-wave electric signal through a differential amplification circuit, a comparison circuit and an output circuit in the detecting unit 6. The electric signal is sent through a terminal of a connector 2 to a computer unit (not shown) which processes the electric signal to detect a rotational angle of the rotary member of magnetic material 21.

A magnetoresistive device (referred to as MR device hereinafter) or a gigantic magnetoresistive device (referred to as GMR device hereinafter) is employed as the magnetic field sensing device.

The MR device is a device of which resistance value varies depending on an angle formed between the magnetized direction and the current direction in a thin film of a ferromagnetic material (e.g., Ni—Fe or Ni—Co). The MR device has a minimum resistance value when the current direction and the magnetized direction cross at a right angle, and a maximum resistance value when the current direction and the magnetized direction cross at 0 degree, i.e., when the two directions are the same or exactly opposed to each other. Such a change in resistance value is called an MR change rate and generally ranges 2–3% for Ni—Fe and 5–6% for Ni—Co.

A GMR device is a so-called artificial lattice film, i.e., a laminate manufactured by alternately forming a magnetic layer and a non-magnetic layer with thicknesses of several angstroms to several tens of angstroms one on top of the other as described in "Magnetoresistance Effect of Artificial Lattice", Journal of the Applied Magnetism Society of Japan, Vol. 15, No. 51991, pp. 813–821. Such known artificial lattice films are represented by (Fe/Cr), (Permalloy/Cu/Co/Cu), and (Co/Cu). The GMR device exhibits a much greater MR effect (MR change rate) than the above-mentioned MR device. Also, the GMR device is a so-called in-plane magnetic sensitive device which produces the same resistance changes regardless of any angular difference in direction of an external magnetic field with respect to a current. Generally, the GMR device has an MR change rate of about 20–30%.

The magnetic detector operates exactly in the same manner in both cases of using the MR device and the GMR device; hence the operation in the case of using the MR device will be described below in detail.

When the rotary member of magnetic material 21 rotates, the magnetic field applied to the MR device is changed and a resistance value of the MR device is also changed. For detecting changes in magnetic field, it is conceivable to form a bridge circuit with MR devices, connect a constant-voltage and constant-current power supply to the bridge circuit, and convert changes in resistance values of the MR devices into voltage changes, thereby detecting changes in the magnetic field acting on the MR devices.

FIG. 18 is an electric circuit diagram of the conventional magnetic detector using MR devices.

The electric circuit of the conventional magnetic detector comprises a bridge circuit 11 using MR devices, a differential amplification circuit 12 for amplifying an output of the bridge circuit 11, a comparison circuit 13 for comparing an output of the differential amplification circuit 12 with a reference value and outputting a signal having a level of "0" or "1", and an output circuit 14 for receiving an output of the comparison circuit 13 and shaping an output signal through switching operation.

The bridge circuit 11 includes MR devices A and B. The MR device A is connected at one terminal to a power source terminal Vcc, and the MR device B is grounded at one terminal. The other terminals of the MR devices A and B are connected to a junction point A. Then, the junction point A of the bridge circuit 11 is connected to an inverted input terminal of an amplifier in the differential amplification circuit 12.

A non-inverted input terminal of the amplifier is connected through a resistor to a voltage dividing circuit which constitutes a reference power supply, and then grounded through a resistor. An output terminal of the amplifier is connected to the inverted input terminal thereof through a resistor, and also to an inverted input terminal of an amplifier in the comparison circuit 13. A non-inverted input terminal of the amplifier in the comparison circuit 13 is connected to a voltage dividing circuit which constitutes a reference power supply, and also to an output terminal thereof through a resistor. An output terminal of the amplifier in the comparison circuit 13 is connected to the power source terminal Vcc through a resistor, and also to a base of a transistor in the output circuit 14. A collector of the transistor is connected to an output terminal and also to the power source terminal vcc through a resistor, whereas an emitter of the transistor is grounded.

FIG. 19 is a waveform chart showing the waveform processing operation of the conventional magnetic detector.

Upon rotation of the rotary member of magnetic material 21, the MR devices are subject to changes in magnetic field and the differential amplification circuit 12 produces an output, shown in FIG. 19B, that varies corresponding to the alternately projected and recessed portions of the rotary member of magnetic material 21 shown in FIG. 19A. The output of the differential amplification circuit 12 is supplied to the comparison circuit 13 and compared with a reference value, i.e., a comparison level, set in the comparison circuit 13 for conversion into a signal having a level of "0" or "1". This signal is then shaped in waveform by the output circuit 14. As a result, an output having steep rising and lowering edges and a level of "0" or "1", shown in FIG. 19C, is produced at the output terminal of the output circuit 14.

Generally, a computer unit used in controllers for internal combustion engines, for example, receives an output signal from a detector and controls equipment based on the received signal. The higher resolution of the output signal, the higher accuracy can be provided by the computer unit in control. A demand for higher accuracy in control is often critical in the art.

With the conventional magnetic detector, however, pulses are output just in the same number as the projected or recessed portions of the rotary member of magnetic material, and an output signal with higher resolution cannot be produced. There has been thus a problem that highly accurate control cannot achieved when the conventional magnetic detector is used as detecting means in, e.g., controllers for internal combustion engines.

SUMMARY OF THE INVENTION

With a view of solving the problem described above, an object of the present invention is to provide a magnetic detector which can output pulses as many as twice the number of projected or recessed portions of a rotary member of magnetic material.

A magnetic detector according to a first aspect of the present invention comprises a magnetic field generating means for generating a magnetic field, a moving member of magnetic material disposed with a predetermined gap retaining relative to the magnetic field generating means and being able to change the magnetic field generated by the magnetic field generating means, and an in-plane-sensitive magnetic field sensing device for detecting changes in the magnetic field by movement of the moving member of magnetic material, wherein the magnetic field sensing device is arranged in a region where a magnetic field acting on the magnetic field sensing device changes from positive to negative and from negative to positive with the movement of the moving member of magnetic material.

In a magnetic detector according to a second aspect of the present invention, in addition to the features of the first aspect, the magnetic field sensing device is arranged to have a magnetic sensitive surface lying vertically to the magnetized direction of the magnetic field generating means which is magnetized in a direction opposing to the moving member of magnetic material, and first center axes of the magnetic field sensing device and the magnetic field generating means are substantially aligned with each other.

In a magnetic detector according to a third aspect of the present invention, in addition to the features of the second aspect, the magnetic field sensing device is arranged between the magnetic field generating means and the moving member of magnetic material in sandwiched relation.

In a magnetic detector according to a fourth aspect of the present invention, in addition to the features of the first aspect, the magnetic field sensing device is arranged to have a magnetic sensitive surface disposed in a first surface of the magnetic field generating means which is magnetized in a direction opposing to the moving member of magnetic material, and first center axes of the magnetic field sensing device and the magnetic field generating means are substantially aligned with each other.

In a magnetic detector according to an fifth aspect of the present invention, in addition to the features of the fourth aspect, the magnetic field sensing device is arranged to have a second center axis substantially aligned with an end surface of the magnetic field generating means which is opposed to the moving member of magnetic material.

In a magnetic detector according to a sixth aspect of the present invention, in addition to the features of the first aspect, a gigantic magnetoresistive device is used as the magnetic field sensing device.

In a magnetic detector according to a seventh aspect of the present invention, in addition to the features of the first aspect, the detector includes a bridge circuit comprising a plurality of magnetic field sensing devices, and at least one of the plurality of magnetic field sensing devices is arranged in a region where resistance changes are saturated.

In a magnetic detector according to an eighth aspect of the present invention, in addition to the features of the seventh aspect, the magnetic field sensing device, which is arranged in the region where resistance changes are saturated, is disposed side by side with respect to another magnetic field sensing device.

In a magnetic detector according to a ninth aspect of the present invention, in addition to the features of the first aspect, the detector includes a bridge circuit comprising at least two magnetic field sensing devices each having anisotropy, one of the two magnetic field sensing devices is arranged to have a magnetism sensing direction coincident with the moving direction of the moving member of magnetic material, and the other of the two magnetic field sensing devices is arranged to have a non-magnetism sensing direction coincident with the moving direction of the moving member of magnetic material.

BRIEF DESCRIPTION OF THE DRAWINGS

FIGS. 3A–3C are a waveform chart showing the waveform processing operation of the magnetic detector according to Embodiment 1 of the present invention;

FIGS. 19A–19C are a waveform chart showing the waveform processing operation of the conventional magnetic detector.

DESCRIPTION OF THE PREFERRED EMBODIMENTS

Preferred embodiments of the present invention will be described below with reference to the drawings.

Embodiment 1

Figure 1A:
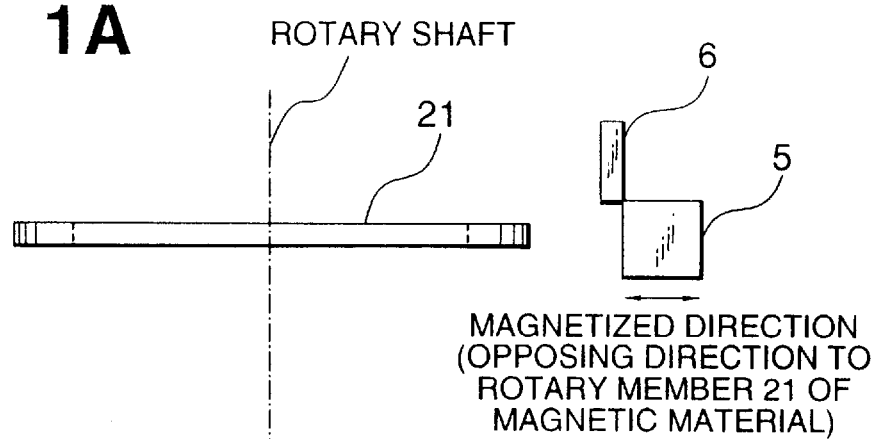
FIGS. 1A–1C is a schematic view showing a magnetic circuit of a magnetic detector according to Embodiment 1 of the present invention.
Figure 1B:
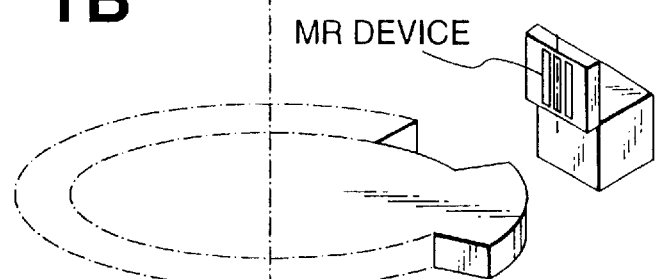
Figure 1C:
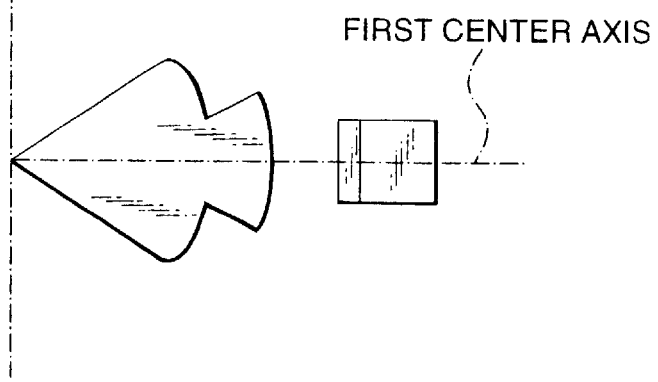

FIG. 1 is a schematic view showing a magnetic circuit of a magnetic detector according to Embodiment 1 of the present invention; specifically, FIG. 1A is a side view, FIG. 1B is a perspective view, and FIG. 1C is a plan view.

Figure 2:
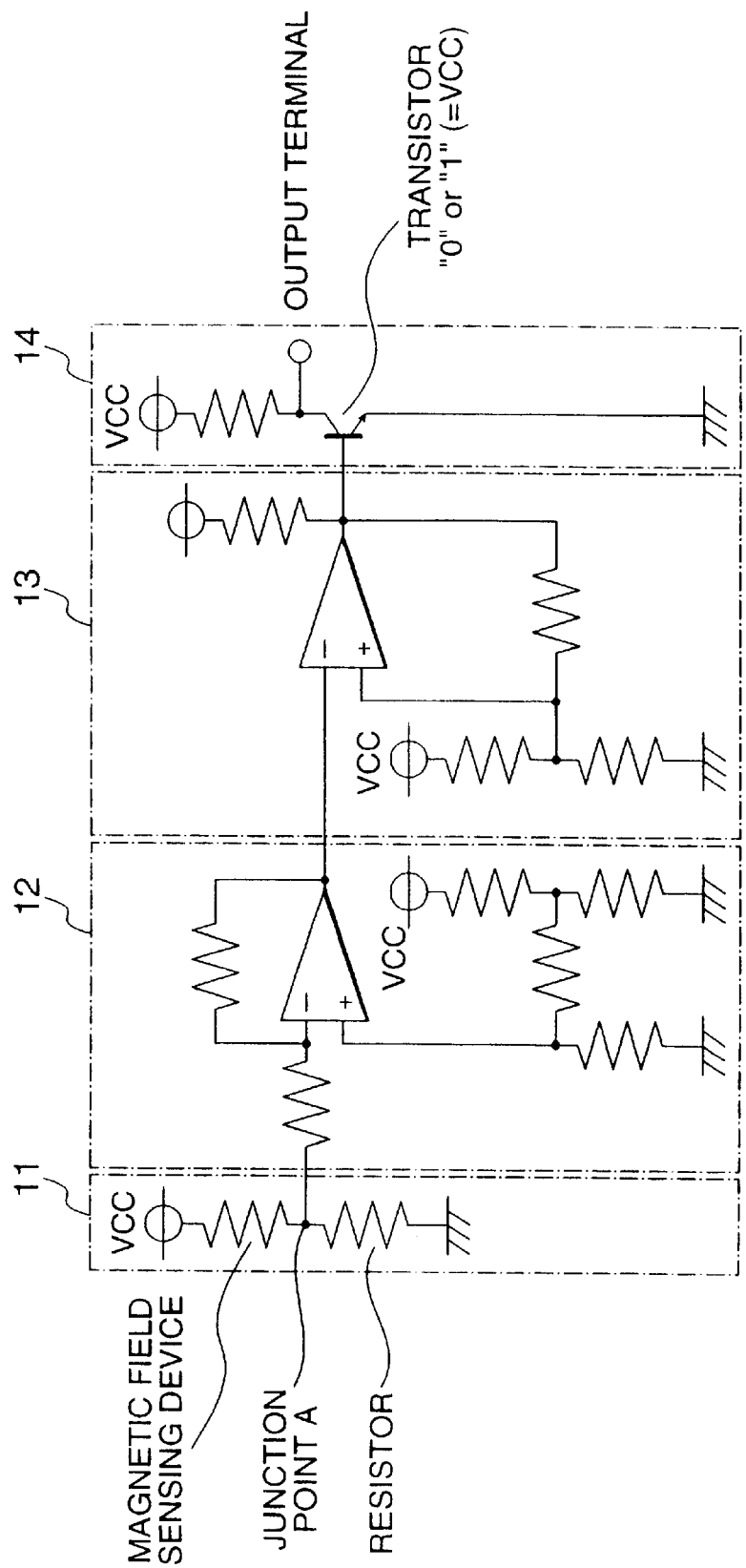
FIG. 2 is an electric circuit diagram of the magnetic detector according to Embodiment 1 of the present invention.

Further, FIG. 2 is an electric circuit diagram and FIG. 3 is a waveform chart showing the waveform processing operation; specifically, FIG. 3A is a plan view showing part of a rotary member of magnetic material 21, FIG. 3B is a waveform chart showing an output signal of a differential amplification circuit 12 and a comparison level in a comparison circuit 13, and FIG. 3C is a waveform chart showing an output signal of an output circuit 14.

In this embodiment, an MR device is used as a magnetic field sensing device and arranged such that it has a magnetic sensitive surface lying vertically to the magnetized direction of a magnet 5 as magnetic field generating means which is magnetized in a direction opposing to the rotary member of magnetic material 21 as a moving member of magnetic material, and that first center axes of the MR device and the magnet 5 are substantially aligned with each other. The MR device and a resistor (FIG. 2) jointly constitute a bridge circuit 11 for converting changes in magnetic field into voltage changes. Thus, in this embodiment, the magnetic field sensing device is arranged in a region where a magnetic field acting on the magnetic field sensing device changes from positive to negative and from negative to positive with the movement of said moving member of magnetic material.

By so constructing the magnetic detector, the output signal of the differential amplification circuit 12 has peaks in the same direction corresponding to each edge of a projected portion 21b of the rotary member of magnetic material 21, as shown in FIG. 3. A point to be noted here is that the MR device has anisotropy. In other words, the MR device must be arranged to have such a pattern direction that the magnetism sensing direction is coincident with the rotating direction of the rotary member of magnetic material 21, as shown in FIG. 1B.

The operation of the magnetic detector according to Embodiment 1 will be described below.

Figure 4:
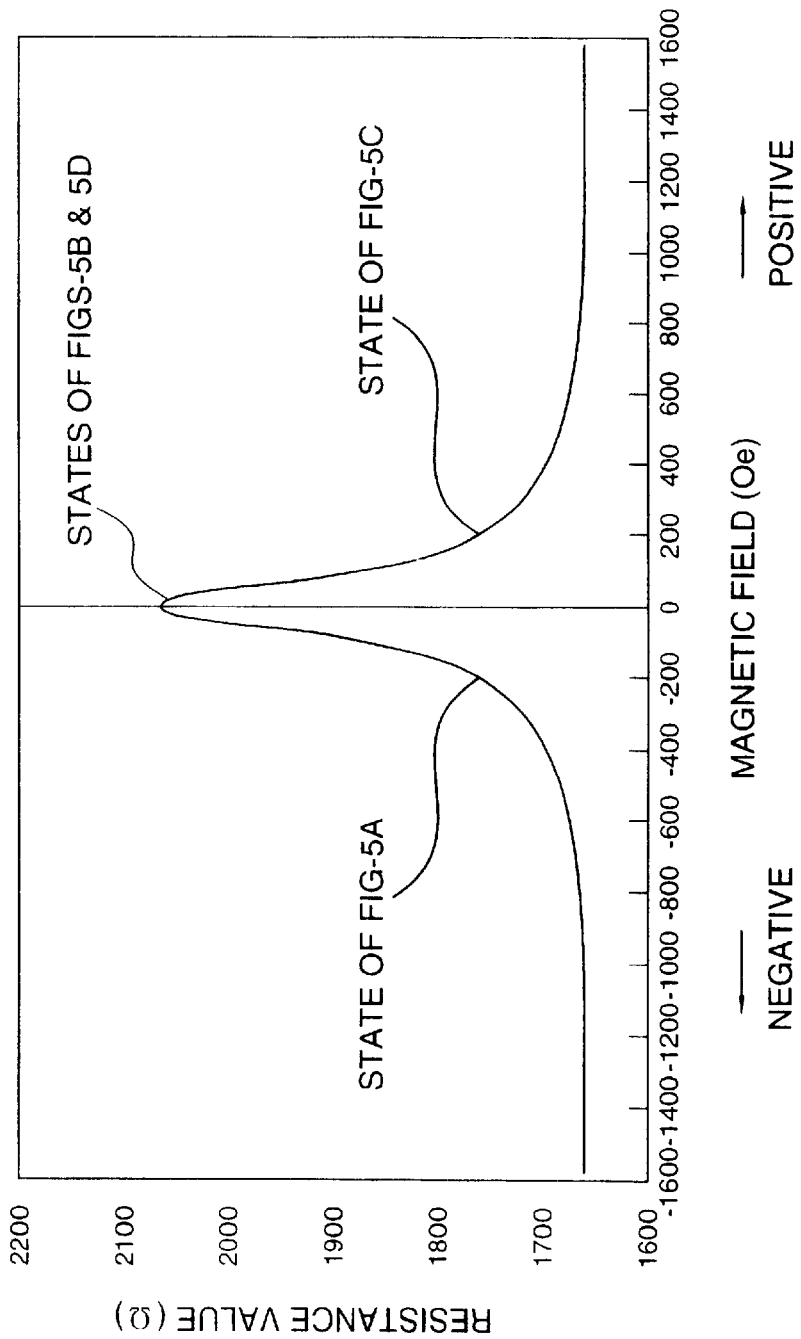
FIG. 4 is a characteristic graph of an MR device.
Figure 5A:
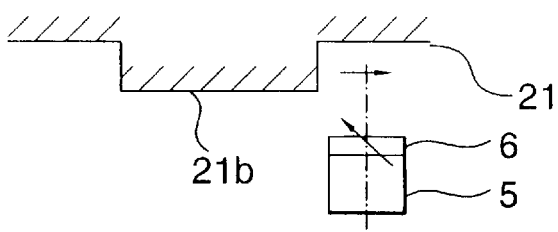
FIGS. 5A–5D are a representation showing states where a magnetic field applied to the MR device is successively changed in the magnetic detector according to Embodiment 1 of the present invention.
Figure 5B:
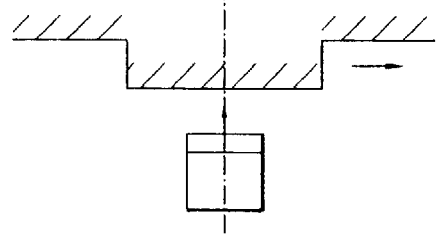
Figure 5C:
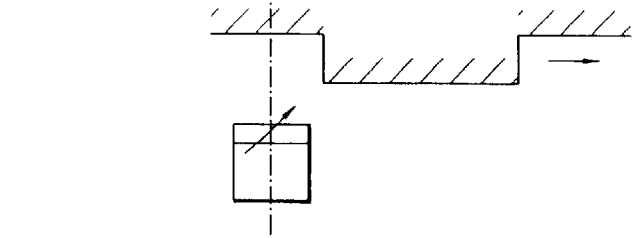
Figure 5D:
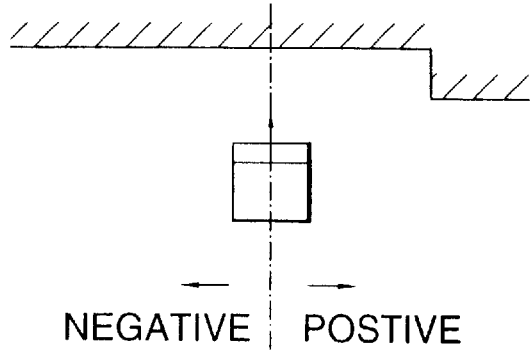

FIG. 4 is a characteristic graph of an ordinary MR device. A resistance value of the MR device is maximum when a component of the magnetic field applied to the MR device in the magnetism sensing direction is zero, and is gradually reduced as the component of the magnetic field in the magnetism sensing direction increases. Also, the MR device exhibits the same characteristic for the magnetic field in both positive and negative directions, i.e., without depending on the direction of the magnetic field. In addition, the MR device has a resistance-change saturation area in which its resistance value is no more changed for a magnetic field stronger than a certain level.

FIG. 5 is a representation showing states where the magnetic field applied to the MR device is successively changed upon rotation of the rotary member of magnetic material 21.

As seen from FIGS. 4 and 5, when the projected portion 21b or recessed portion 21a of the rotary member of magnetic material 21 is exactly opposed to the MR device, the magnetic field applied to the MR device is zero and therefore the resistance value of the MR device is maximum. When either edge of the projected portion 21b of the rotary member of magnetic material 21 is opposed to the MR device, the magnetic field applied to the MR device is produced and therefore the resistance value of the MR device is reduced. Since the above operation is repeated with rotation of the rotary member of magnetic material 21, the output signal has peaks corresponding to each edge of the projected portion 21b of the rotary member of magnetic material 21. By setting the comparison level of the comparison circuit 13 in consideration of the peak level, the output signal can be produced with pulses as many as twice the number of the projected portions 21b or recessed portions 21a of the rotary member of magnetic material 21. As a result, it is possible to achieve a magnetic detector which can produce an output signal with high resolution and is suitably used in, e.g., controllers for internal combustion engines requiring highly accurate control.

Embodiment 2

Figure 6A:
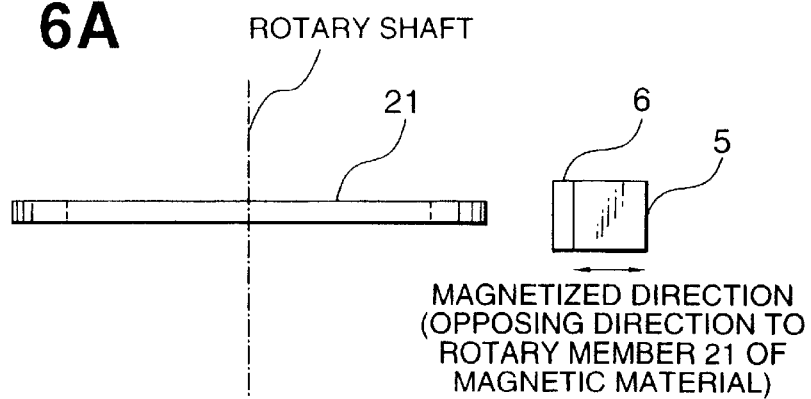
FIGS. 6A–6C are a schematic view showing a magnetic circuit of a magnetic detector according to Embodiment 2 of the present invention.
Figure 6B:
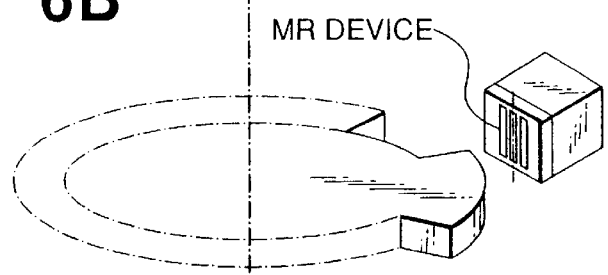
Figure 6C:
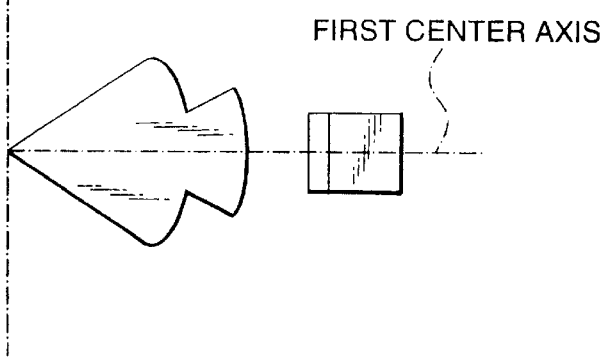

FIG. 6 is a schematic view showing a magnetic circuit of a magnetic detector according to Embodiment 2 of the present invention; specifically, FIG. 6A is a side view, FIG. 6B is a perspective view, and FIG. 6C is a plan view.

In the construction of Embodiment 1, the magnetic field is changed to a large extent in an area which is positioned between the magnet 5 and the rotary member of magnetic material 21 in sandwiched relation. By arranging the MR device in such an area, the magnetic detector can produce a large output and hence have an improved characteristic. Further, the magnetic detector can be realized with a smaller size than that of Embodiment 1 while ensuring comparable performance.

Embodiment 3

Figure 7A:
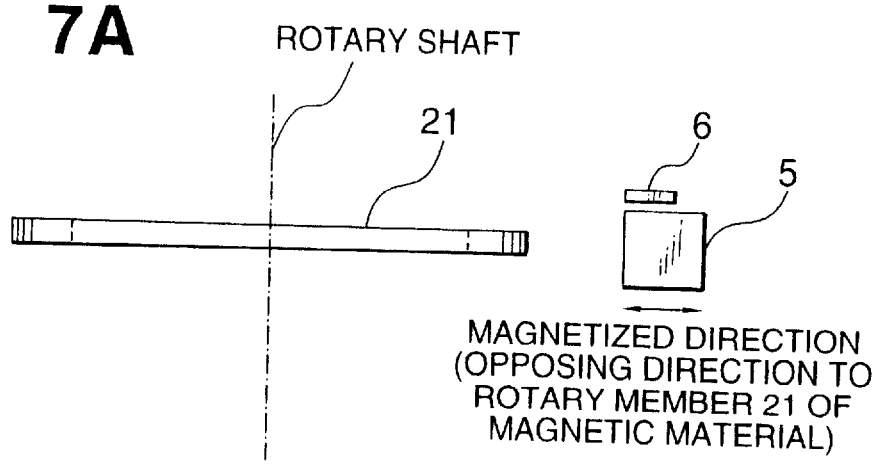
FIGS. 7A–7C are a schematic view showing a magnetic circuit of a magnetic detector according to Embodiment 3 of the present invention.
Figure 7B:
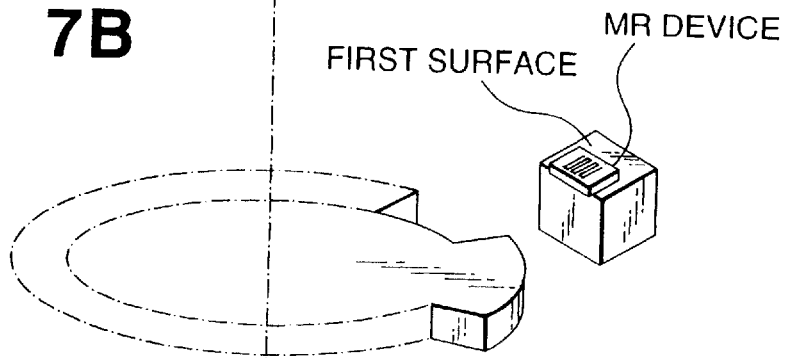
Figure 7C:
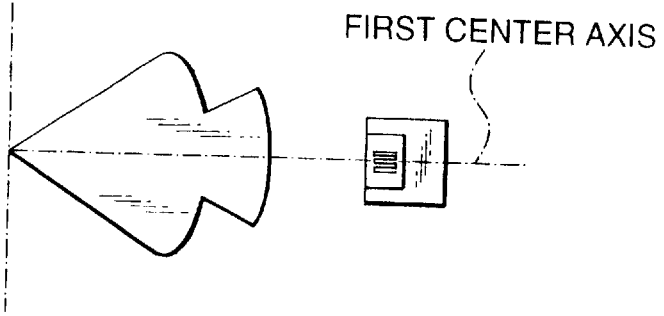

FIG. 7 is a schematic view showing a magnetic circuit of a magnetic detector according to Embodiment 3 of the present invention; specifically, FIG. 7A is a side view, FIG. 7B is a perspective view, and FIG. 7C is a plan view. Note that an electric circuit diagram and a waveform chart showing the waveform processing operation in this embodiment are the same as those in above Embodiment 1 and hence omitted here.

In this embodiment, an MR device is used as the magnetic field sensing device. A detecting unit 6 with the MR device incorporated therein is provided on a first (upper) surface of the magnet 5 which is magnetized in a direction opposing to the rotary member of magnetic material 21, and is arranged such that first center axes of the MR device and the magnet 5 are substantially aligned with each other.

The MR device and a resistor (FIG. 2) jointly constitute the bridge circuit 11 for converting changes in magnetic field into voltage changes. By so constructing the magnetic detector, the output signal of the differential amplification circuit 12 has peaks in the same direction corresponding to each edge of the projected portion 21b of the rotary member of magnetic material 21, as shown in FIG. 3. By setting the comparison level of the comparison circuit 13 in consideration of the peak level, the output signal can be produced with pulses as many as twice the number of the projected portions 21b of the rotary member of magnetic material 21.

A point to be noted here is that the MR device has anisotropy. In other words, the MR device must be arranged to have such a pattern direction that the magnetism sensing direction is coincident with the rotating direction of the rotary member of magnetic material 21, as shown in FIG. 7B.

Figure 8:
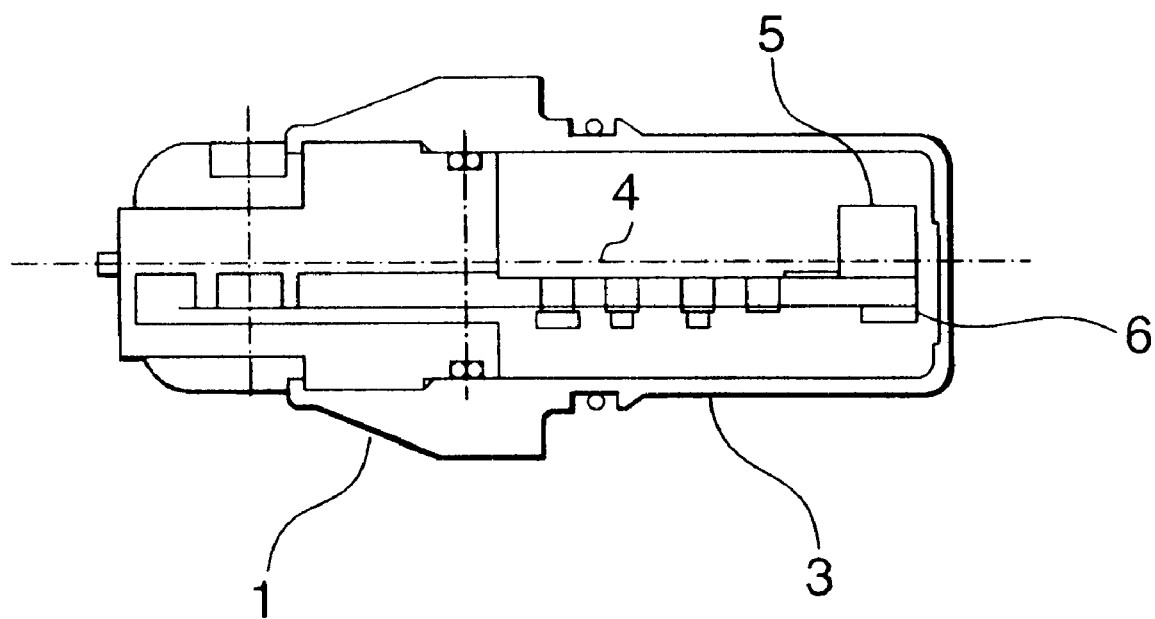
FIG. 8 is a sectional view of the magnetic detector according to Embodiment 3 of the present invention.
Figure 16:
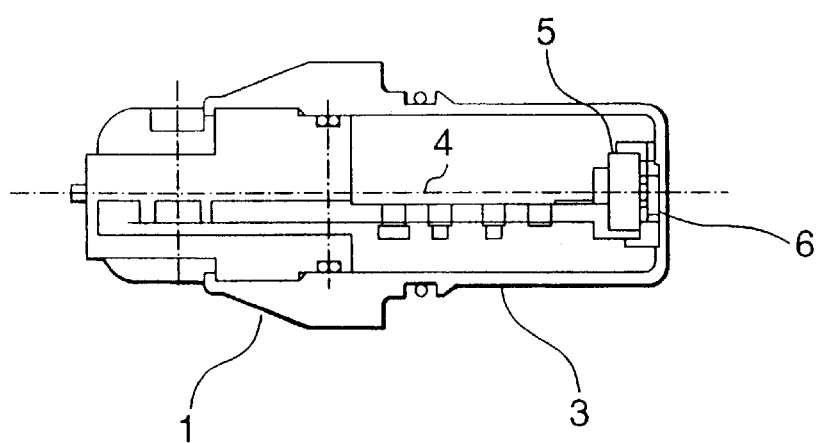
FIG. 16 is a side sectional view of the conventional magnetic detector.
Figure 17A:
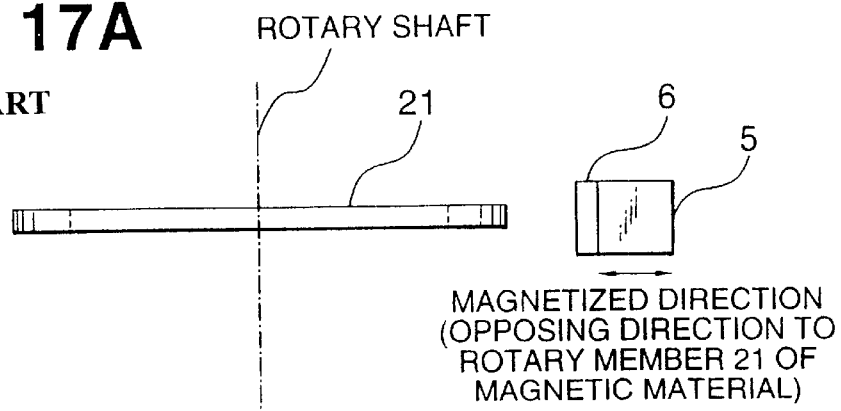
FIGS. 17A–17C are a schematic view showing a magnetic circuit of the magnetic detector.
Figure 17B:
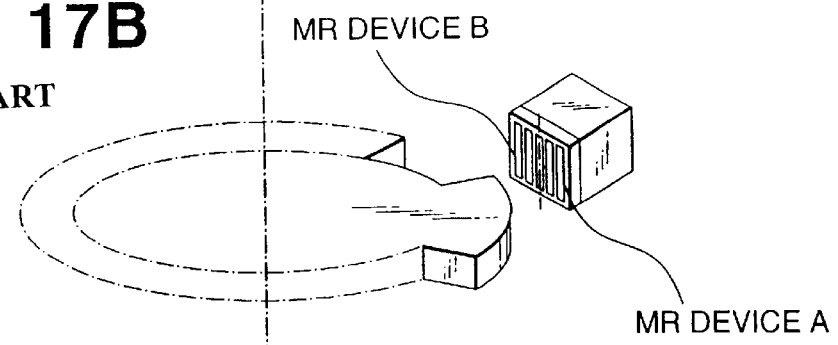
Figure 17C:
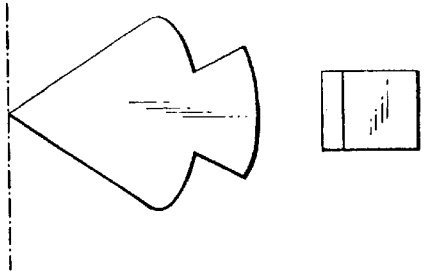
Figure 18:
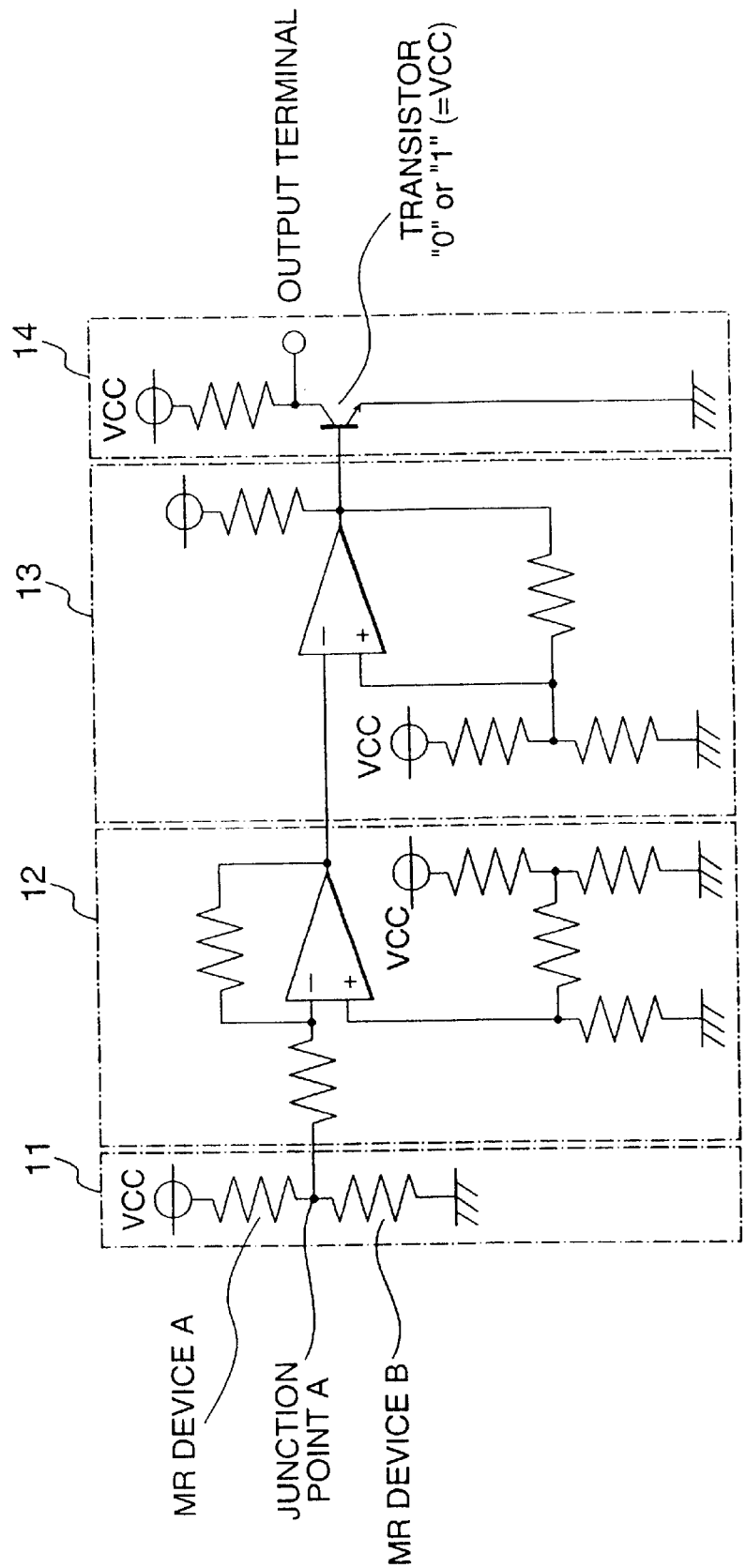
FIG. 18 is an electric circuit diagram of the conventional magnetic detector.

FIG. 8 is a sectional view of the magnetic detector according to this Embodiment 3. In above Embodiments 1 and 2, a mount surface of the detecting unit 6 and a mount surface of electronic parts constituting an electric circuit unit 4 are positioned perpendicularly to each other as with the conventional magnetic detector shown in FIG. 16. This type of magnetic detector is required to be mounted from two directions, or to be first mounted from one direction and then bent perpendicularly with respect to the mounting direction.

In this embodiment, since the detecting unit 6 is provided on the first (upper) surface of the magnet 5, which is magnetized in the opposing direction to the rotary member of magnetic material 21, and is arranged such that the first center axes of the MR device and the magnet 5 are substantially aligned with each other, mounting of the detecting unit 6 and mounting of electronic parts constituting the electric circuit unit 4 can be made in the same direction, resulting in improved productivity. Also, since there is no need of additional bending after the mounting in one direction, the position of the detecting unit 6 with respect to the magnet 5 is stabilized and a characteristic of the magnetic detector is improved.

Embodiment 4

Figure 9A:
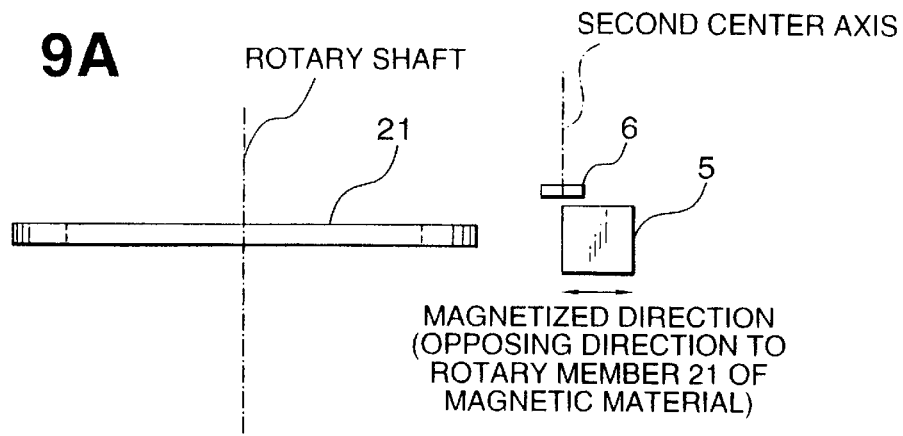
FIGS. 9A–9C are a schematic view showing a magnetic circuit of a magnetic detector according to Embodiment 4 of the present invention.
Figure 9B:
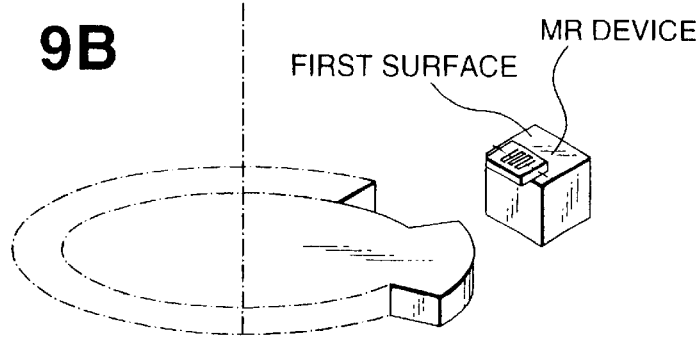
Figure 9C:
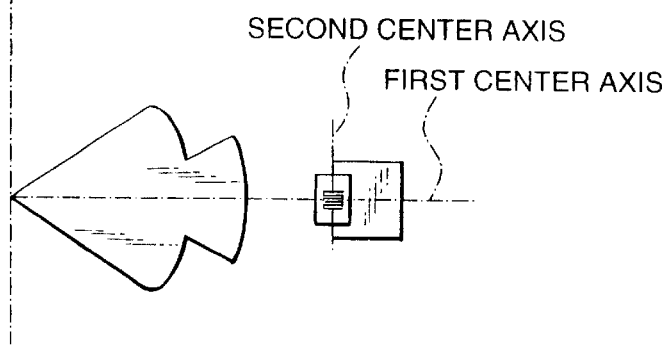

FIG. 9 is a schematic view showing a magnetic circuit of a magnetic detector according to Embodiment 4 of the present invention; specifically, FIG. 9A is a side view, FIG. 9B is a perspective view, and FIG. 9C is a plan view.

Embodiment 4 is modified from Embodiment 3 in that the MR device has a second center axis substantially aligned with an end surface of the magnet 5 which is opposed to the rotary member of magnetic material 21. With such an arrangement, the magnetic device can operate by essentially utilizing a characteristic range of the MR device where it has a maximum resistance change rate. It is therefore possible to produce a larger output and improve a characteristic of the magnetic detector.

Embodiment 5

While the MR device is used as the magnetic field sensing device in each of above Embodiments, Embodiment 5 uses a GMR (gigantic magnetoresistive) device. By using a GMR device, it is possible to produce a larger output and achieve a better characteristic of the magnetic detector than using the MR device. Further, since the GMR device has no anisotropy, the magnetic detector can be designed with more flexibility while the pattern direction is not subject to any restriction.

Embodiment 6

Figure 10A:
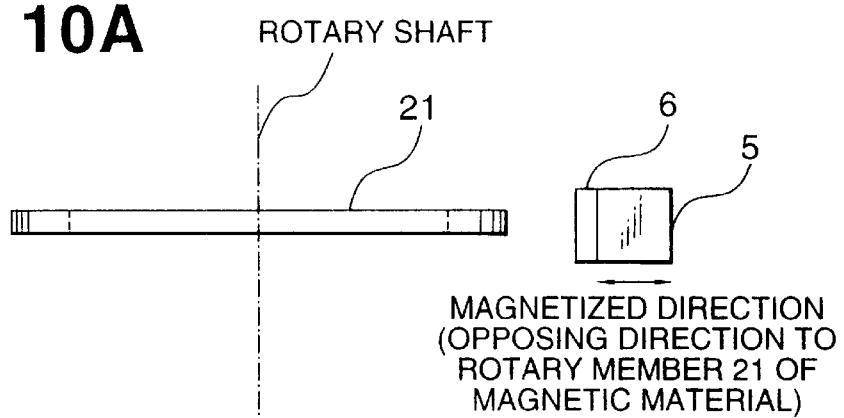
FIGS. 10A–10C are a schematic view showing a magnetic circuit of a magnetic detector according to Embodiment 6 of the present invention.
Figure 10B:
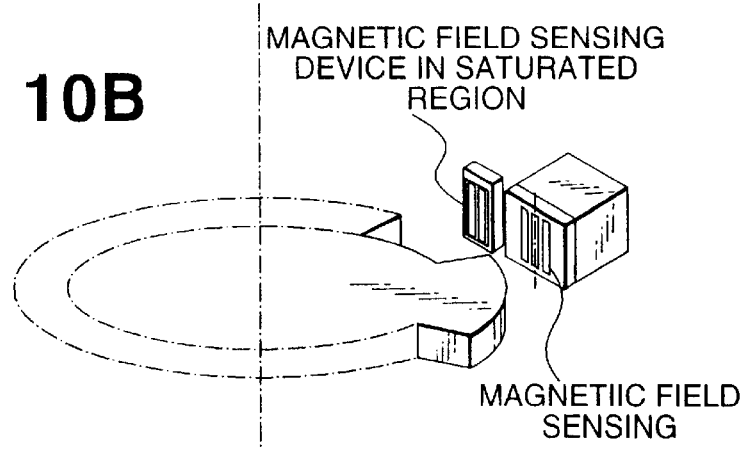
Figure 10C:
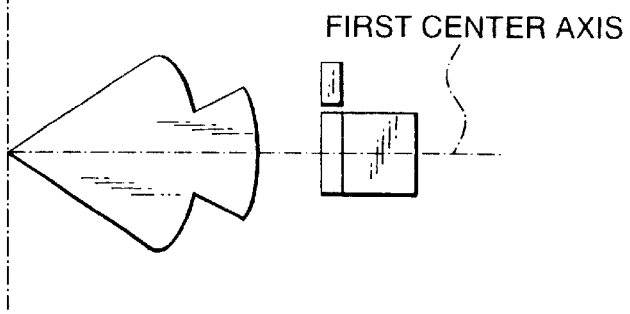
Figure 11A:
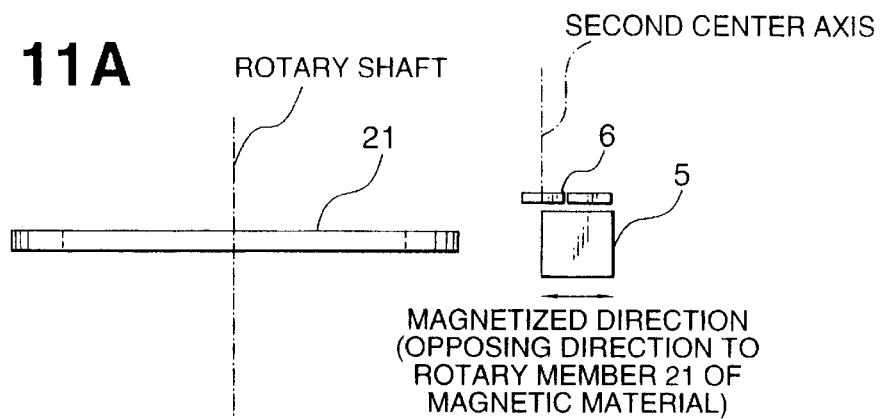
FIGS. 11A–11C are a schematic view showing the magnetic circuit of the magnetic detector according to Embodiment 6 of the present invention.
Figure 11B:
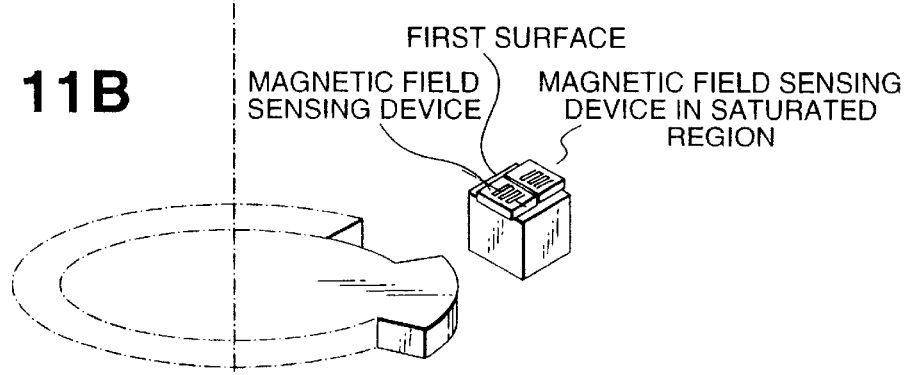
Figure 11C:
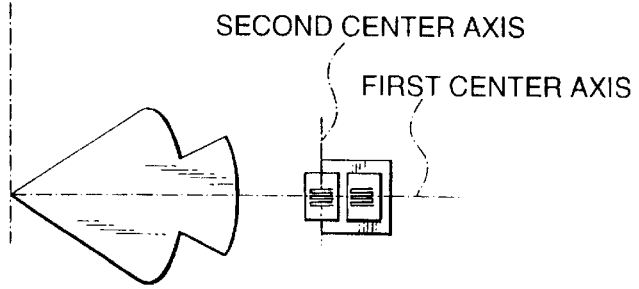

FIGS. 10 and 11 are schematic views each showing a magnetic circuit of a magnetic detector according to Embodiment 6 of the present invention; specifically, FIGS. 10A and 11A are side views, FIGS. 10B and 11B are perspective views, and FIGS. 10C and 11C are plan views.

In each of above Embodiments, the bridge circuit 11 (FIG. 2) is made up of the magnetic field sensing device and the resistor. However, since the magnetic field sensing device and the resistor have temperature coefficients much different from each other, the potential at a junction point A (FIG. 2) is considerably changed upon changes in temperature. Accordingly, a temperature compensation circuit (not shown) is required to achieve a magnetic detector having a good characteristic.

In this Embodiment, a device having the same structure as the magnetic field sensing device in the detecting unit 6 is used as the resistor of the bridge circuit 11 so that the components of the bridge circuit have temperature coefficients coincident with each other. Since another magnetic field sensing device is used to serve as a resistor, it is not required to change its resistance value and hence is arranged in a position where the magnetic field changes in such a range (e.g., not less than +600 (Oe) or not more than −600 (Oe)) that resistance changes are saturated.

In the construction of FIG. 10, the magnetic field sensing device in the detecting unit 6 is arranged, by way of example, as with above Embodiment 2, and another magnetic field sensing device serving as a resistor is arranged near the above magnetic field sensing device in a position where the magnetic field changes in such a range that resistance changes are saturated.

Also, in the construction of FIG. 11, the magnetic field sensing device in the detecting unit 6 is arranged, by way of example, as with Embodiment 4, and another magnetic field sensing device serving as a resistor is arranged near the above magnetic field sensing device in a position where the magnetic field changes in such a range that resistance changes are saturated.

With this embodiment, in addition to the above-mentioned advantages of producing a larger output and improving a characteristic of the magnetic detector, a magnetic detector having a better characteristic can be achieved without adding a temperature compensation circuit.

Embodiment 7

Figure 12A:
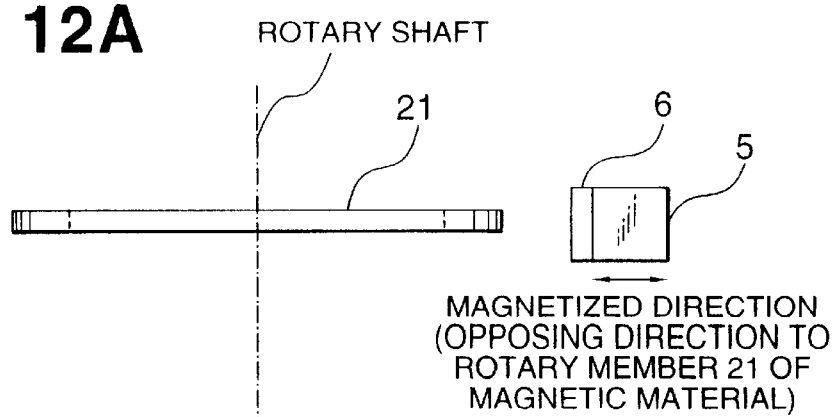
FIGS. 12A–12C are a schematic view showing a magnetic circuit of a magnetic detector according to Embodiment 7 of the present invention.
Figure 12B:
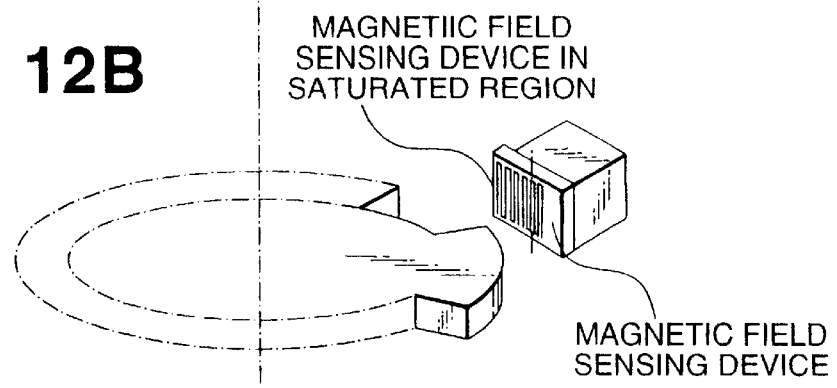
Figure 12C:
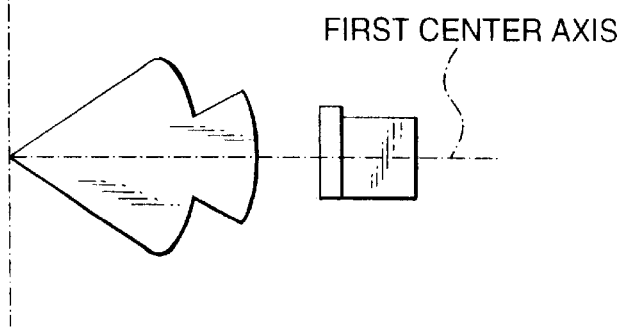
Figure 13A:
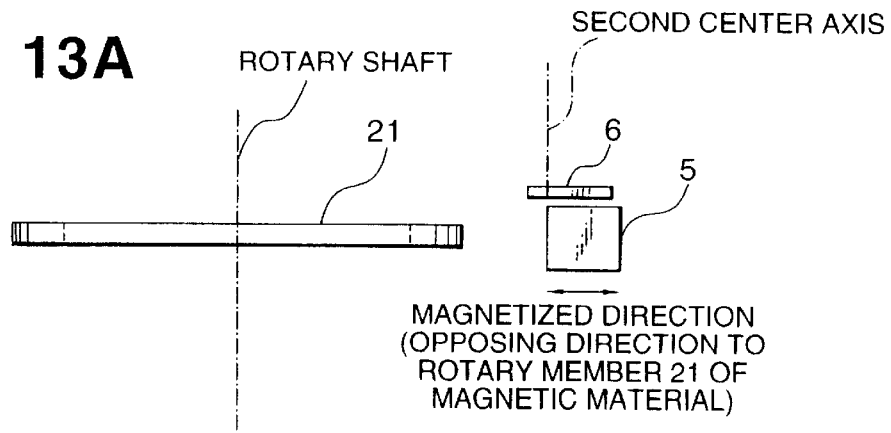
FIGS. 13A–13C are a schematic view showing the magnetic circuit of the magnetic detector according to Embodiment 7 of the present invention.
Figure 13B:
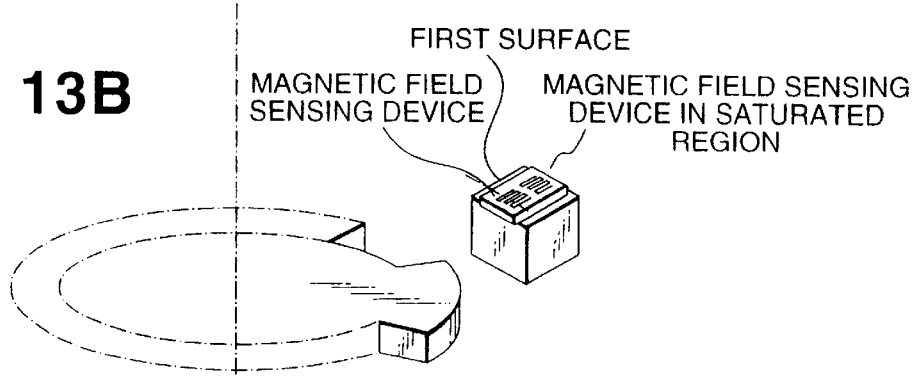
Figure 13C:
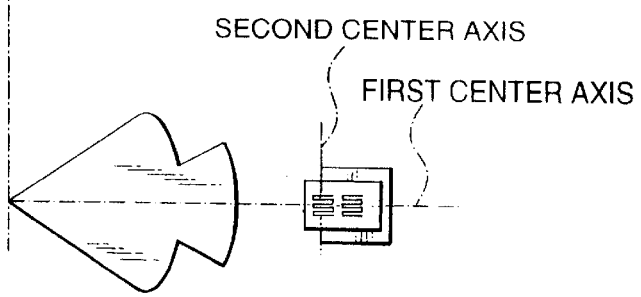

FIGS. 12 and 13 are schematic views each showing a magnetic circuit of a magnetic detector according to Embodiment 7 of the present invention; specifically, FIGS. 12A and 13A are side views, FIGS. 12B and 13B are perspective views, and FIGS. 12C and 13C are plan views.

In this embodiment, a similar advantage as in Embodiment 6 is obtained by arranging the magnetic field sensing device, which serves as a resistor in Embodiment 6, in the detecting unit 6 side by side with respect to the magnetic field sensing device therein. With such an arrangement, since this embodiment can provide another advantage that two magnetic field sensing devices are integrally formed in the detecting unit 6 at the same time, the magnetic detector can be manufactured with higher productivity and smaller size.

Embodiment 8

Figure 14A:
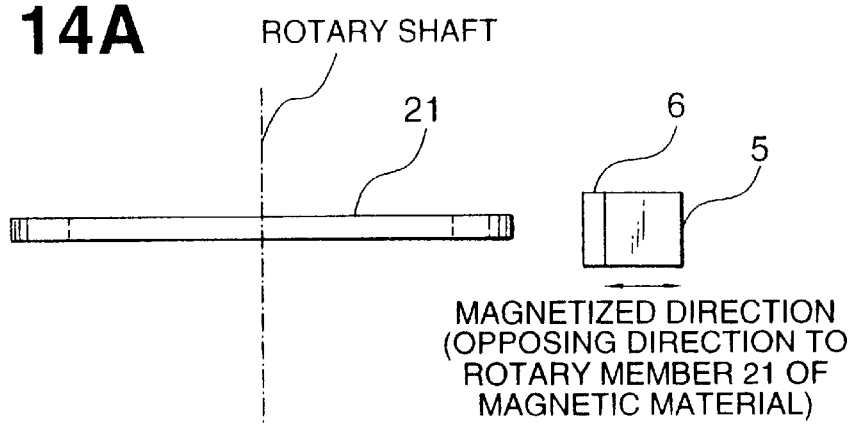
FIGS. 14A–14C are a schematic view showing a magnetic circuit of a magnetic detector according to Embodiment 8 of the present invention.
Figure 14B:
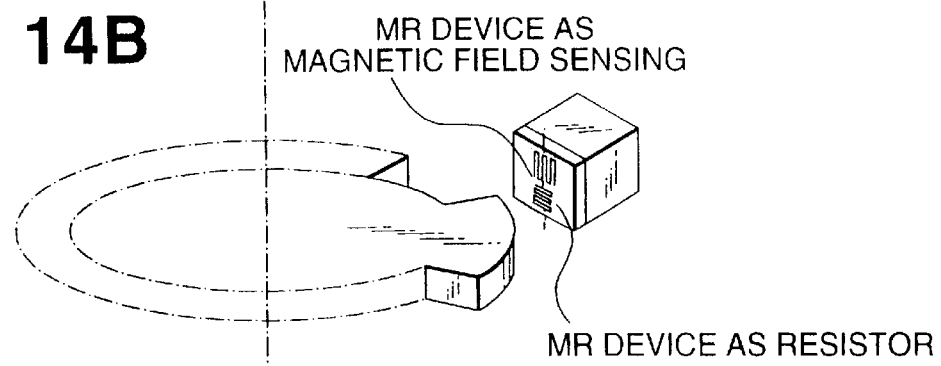
Figure 14C:
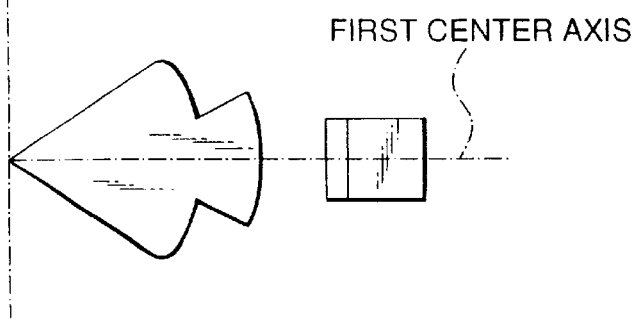
Figure 15:
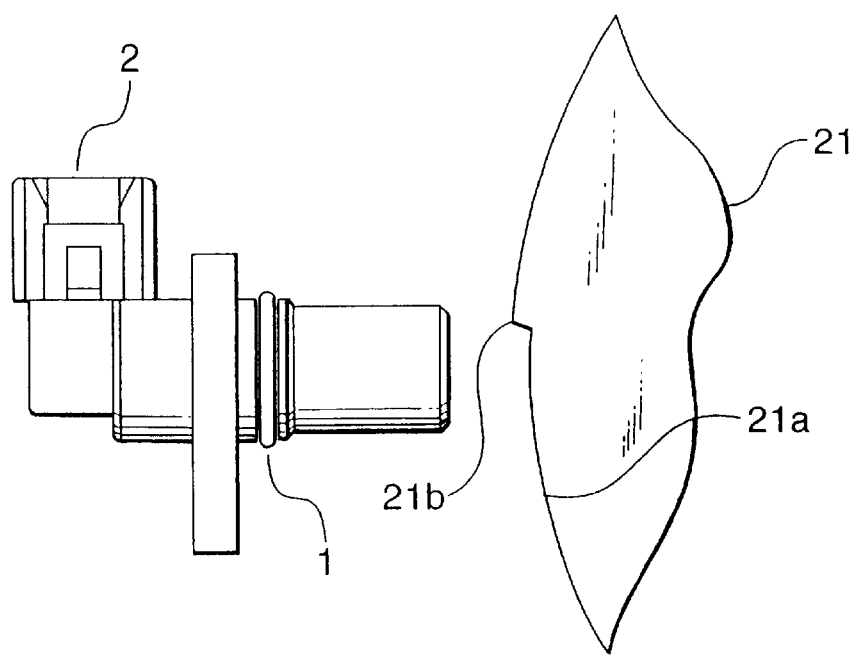
FIG. 15 is a side view of a conventional magnetic detector.

FIG. 14 is a schematic view showing a magnetic circuit of a magnetic detector according to Embodiment 8 of the present invention; specifically, FIG. 14A is a side view, FIG. 14B is a perspective view, and FIG. 14C is a plan view.

In this embodiment, the bridge circuit 11 is made up of MR devices serving as a magnetic field sensing device and a resistor, respectively. These MR devices are arranged such that the magnetism sensing direction of the MR device serving as a magnetic field sensing device is coincident with the rotating direction of the rotary member of magnetic material, the non-magnetism sensing direction of the MR device serving as a resistor is coincident with the rotating direction of the rotary member of magnetic material, and first center axes of those MR devices and the magnet 5 are substantially aligned with each other.

By using, as a resistor, a device which has the same structure as the magnetic field sensing device in the detecting unit 6, the temperature coefficients of components of the bridge circuit can be made coincident with each other. In above Embodiments, however, there still remain a slight difference in temperature coefficient because the magnetic field sensing device serving as a resistor is arranged in a region where resistance changes are saturated, the region being different from an operating region of the magnetic field sensing device.

To eliminate such a difference in temperature coefficient, it is required that both the magnetic field sensing devices be arranged in respective regions where the magnetic field is changed in the same manner. By so arranging both the magnetic field sensing devices, however, if these magnetic field sensing devices have no anisotropy like a GMR device, voltages changes cannot be produced in the bridge circuit 11 because resistance values of the magnetic field sensing devices are changed in the same manner. On the other hand, when magnetic field sensing devices having no anisotropy like an MR device are arranged as described above, the MR device serving as a magnetic field sensing device and the MR device serving as a resistor are both subject to the same changes in magnetic field. Further, since the MR device serving as a resistor is arranged such that the non-magnetism sensing direction thereof is coincident with the rotating direction of the rotary member of magnetic material, the resistance value of the MR device serving as a resistor is not changed and voltage changes are produced in the bridge circuit 11.

As a result, a magnetic detector having an even improved temperature characteristic can be achieved.

Embodiment 9

While, in each of above Embodiments, the moving member of magnetic material has been described as a rotary member of magnetic material which is rotated in synch with a rotary shaft, the present invention is likewise applicable to a moving member of magnetic material which displaces linearly, and similar advantages can also be obtained. As applications of this embodiment, it is conceivable to detect, e.g., an opening of an EGR valve used in internal combustion engines.

What is claimed is:

1. A magnetic detector comprising:

magnetic field generating means for generating a magnetic field;

a moving member of magnetic material rotating about a rotational axis and disposed a predetermined distance apart from said magnetic field generating means for changing the magnetic field generated by said magnetic field generating means; and a magnetic field sensing device for detecting changes in the magnetic field by movement of said moving member of magnetic material, said magnetic field sensing device comprising a single magnetoresistive device disposed relative to said magnetic field generating means so that a first center axis of an upper surface of said magnetoresistive device and a center axis of an upper surface of said magnetic field generating means lie in a common plane, and a magnetic field acting on said magnetic field sensing device changes from positive to negative and from negative to positive with the movement of said moving member of magnetic material, wherein said magnetic field sensing device is not interposed between said magnetic field generating means and said moving member of magnetic material.

2. A magnetic detector according to claim 1, wherein said magnetic field sensing device is disposed to have a magnetic sensitive surface positioned vertically with respect to a front surface of said magnetic field generating means.

3. A magnetic detector comprising:

magnetic field generating means for generating a magnetic field;

a moving member of magnetic material rotating about a rotational axis and disposed a predetermined distance apart from said magnetic field generating means for changing the magnetic field generated by said magnetic field generating means; and a magnetic field sensing device for detecting changes in the magnetic field by movement of said moving member of magnetic material, said magnetic field sensing device comprising a single magnetoresistive device disposed relative to said magnetic field generating means so that a first center axis of an upper surface of said magnetoresistive device and a center axis of an upper surface of said magnetic field generating means lie in a common plane, and a magnetic field acting on said magnetic field sensing device changes from positive to negative and from negative to positive with the movement of said moving member of magnetic material, wherein said magnetic field sensing device is disposed to have a magnetic sensitive surface disposed on the upper surface of said magnetic field generating means.

4. A magnetic detector according to claim 3, wherein a second center axis of the upper surface of said magnetoresistive device is aligned with a front surface of said magnetic field generating means, wherein said second center axis is perpendicular said first center axis.

5. A magnetic detector according to claim 1, wherein said magnetoresistive device comprises a gigantic magnetoresistive device.

6. A magnetic detector comprising:

magnetic field generating means for generating a magnetic field;

a moving member of magnetic material rotating about a rotational axis and disposed a predetermined distance apart from said magnetic field generating means for changing the magnetic field generated by said magnetic field generating means; and a magnetic field sensing device for detecting changes in the magnetic field by movement of said moving member of magnetic material, wherein said magnetic field sensing device comprises a bridge circuit comprising a plurality of magnetoresistive devices, a first one of said magnetoresistive devices being disposed relative to said magnetic field generating means so that a center axis of an upper surface of said first one of said magnetoresistive devices and a center axis of an upper surface of said magnetic field generating means lie in a common plane, and a magnetic field acting on said magnetic field sensing device changes from positive to negative and from negative to positive with the movement of said moving member of magnetic material, and a second one of said plurality of magnetoresistive devices is disposed in a region where resistance changes are saturated.

7. A magnetic detector according to claim 6, wherein said second one of said magnetoresistive devices is disposed side by side with respect to first one of said magnetoresistive devices.

8. A magnetic detector comprising:

magnetic field generating means for generating a magnetic field;

a moving member of magnetic material rotating about a rotational axis and disposed a predetermined distance apart from said magnetic field generating means for changing the magnetic field generated by said magnetic field generating means; and a magnetic field sensing device for detecting changes in the magnetic field by movement of said moving member of magnetic material, wherein said magnetic field sensing device comprises a bridge circuit comprising at least two magnetoresistive devices each having anisotropy, a first one of said two magnetoresistive devices being disposed relative to said magnetic field generating means so that a center axis of an upper surface of said first one of said magnetoresistive devices and a center axis of an upper surface of said magnetic field generating means lie in a common plane, and a magnetic field acting on said magnetic field sensing device changes from positive to negative and from negative to positive with the movement of said moving member of magnetic material, wherein said first one of said magnetoresistive devices is arranged so that a magnetoresistive pattern of said first one of the magnetoresistive devices has a magnetism sensing direction which is coincident with the moving direction of said moving member of magnetic material, and a second one of said magnetoresistive devices is arranged so that a magnetoresistive pattern of said second one of the magnetoresistive devices has a non-magnetism sensing direction which is coincident with the moving direction of said moving member of magnetic material.

* * * * *